United States Patent [19]

Long et al.

[11] 4,108,528
[45] * Aug. 22, 1978

[54] PROBE ACTUATOR ASSEMBLY

[75] Inventors: Everett James Long, Claremont; Elmer W. Muench, Covina, both of Calif.

[73] Assignee: Everett/Charles, Inc., Pomona, Calif.

[*] Notice: The portion of the term of this patent subsequent to Jul. 25, 1994, has been disclaimed.

[21] Appl. No.: 818,206

[22] Filed: Jul. 22, 1977

Related U.S. Application Data

[63] Continuation of Ser. No. 747,611, Dec. 6, 1976, abandoned.

[51] Int. Cl.² .............................................. H01R 3/04
[52] U.S. Cl. ............................. 339/117 P; 324/158 P; 339/18 R; 339/59 M; 339/143 R
[58] Field of Search .................... 324/73 R, 158 R; 339/117 P, 18 R, 59 M, 143 R

[56] References Cited

U.S. PATENT DOCUMENTS

| | | | |
|---|---|---|---|
| 3,016,489 | 1/1962 | Briggs et al. | 339/18 R X |
| 3,401,369 | 9/1968 | Palmateer et al. | 339/143 R X |
| 3,405,361 | 10/1968 | Kattner et al. | 324/158 R |
| 3,596,228 | 7/1971 | Reed, Jr. et al. | 339/59 M |
| 3,757,219 | 9/1973 | Aksu | 324/158 P X |

*Primary Examiner*—Roy Lake
*Assistant Examiner*—DeWalden W. Jones
*Attorney, Agent, or Firm*—Christie, Parker & Hale

[57] ABSTRACT

Apparatus is disclosed for making electrical contact with test points, such as in a printed circuit, on a test member. A mounting is provided for the test member at a location for test. A plurality of spaced conductive probe heads each have, oppositely facing, a contact side and a bearing side and are arranged in an array corresponding to the test points on the test member. The contact sides are adjacent the test member location. At least one resilient member has one side adjacent the bearing sides of the probe heads. A backup plate has a bearing side adjacent the opposite side of the resilient member from the probe heads. Pressure is applied through the backup plate and the resilient member to the bearing side of the probe heads forcing the contact sides of the probe heads in the direction of the test member location. The backup plate is harder than and substantially more rigid than the resilient member but is sufficiently flexible so that with the probe heads in engagement with the test member the backup plate conforms to the shape of the facing surface of the test member and the resilient member deforms so that all of the probe heads are forced into engagement with test points on the test member.

18 Claims, 8 Drawing Figures

PROBE ACTUATOR ASSEMBLY

CROSS-REFERENCE TO RELATED APPLICATIONS

This is a continuation of application Ser. No. 747,611, filed Dec. 6, 1976, now abandoned.

BACKGROUND OF THE INVENTION

This invention relates to apparatus for actuating a plurality of probes into electrical contact with a plurality of generally planar test points on a test member.

Circuit board verifiers are generally known employing an actuator assembly for moving a plurality of electrical test probes into electrical contact with a plurality of generally planar test points on a circuit board under test.

The probes are generally elongated, having a probe head at one end for making electrical contact with a test point on the circuit board and an opposite end electrically connected to a test device such as a circuit board analyzer. Continuity and lack of continuity are detected by the analyzer between the various test points on the circuit board for use in determining if the circuit board is proper or defective.

Different approaches have been utilized for bringing the array of test probes and the circuit board under test into engagement. One class of these devices is vacuum actuated and employs an array of probes mounted in a fixed backing member. A stiff backing, for receipt of a circuit board for test, is flexibly mounted so that it is movable relative to the fixed backing member. Holes are cut through the stiff backing corresponding to the location of test points on the circuit board through which the probes may extend. A sealing member is mounted in opposing relation to the backing member. The chamber is evacuated, drawing the sealing member and the circuit board, and the stiff backing, in the direction of the probes until the probe heads are in electrical contact with the circuit board.

Problems exist with such an arrangement. By way of example, the pressure required to draw the circuit board towards the probes causes the backing in which the probes are mounted and the printed circuit board to bow. Telescoping spring probes are used to compensate for the variations in the circuit board and/or the backing (and hence the position of the ends of the probes). However, the telescoping spring probes are quite costly since they must be made in miniature size in order to allow very close spacing, for example, in the order of 0.100 inch on center.

Other arrangements have been made for bringing an array of probes and circuit board together for test. For example, a movable platen has been used for engaging a circuit board with an array of spaced contact probes. However, such arrangements are generally slow and costly.

SUMMARY OF THE INVENTION

Accordingly an embodiment of the present invention is an apparatus for making electrical contact with substantially planar test points, such as in a printed circuit, on a test member. A plurality of conductive probe heads each have, oppositely facing, a contact side and a bearing side and are arranged in an array corresponding to the test points on the test member. The contact sides of the probe heads are positioned adjacent the test member location. At least one resilient member has one side adjacent the bearing sides of the probe heads. A backup means is provided with a bearing side adjacent the opposite side of the resilient member from the probe heads. Pressure is applied through the backup means and the at least one resilient member to the bearing sides of the probe heads, forcing the contact sides thereof in the direction of the test member location. The backup means is harder than and substantially more rigid than the resilient member but is flexible so that with the probe heads in engagement with the test member, the backup means conforms to the shape of the facing surface of the test member and the resilient member deforms so that all of the probe heads are forced into tight engagement with the test points on the test member. With such an arrangement, telescoping spring loaded probes are not required.

Reference is now made to the drawings which show specific operative embodiments of the invention but which are not to be taken as limiting the scope of the invention as defined in the claims.

DESCRIPTION

Refer now to the embodiment of the invention depicted in FIGS. 1, 2, 3A, 3B and 4. A circuit board verifier or tester 10 is shown for making electrical contact between an array or probes and a plurality of generally planar test points on a test member. Electronic circuitry, displays and other items (not shown) are employed for verifying continuity and the lack of continuity between various test points on a circuit board under test.

Figure 1:
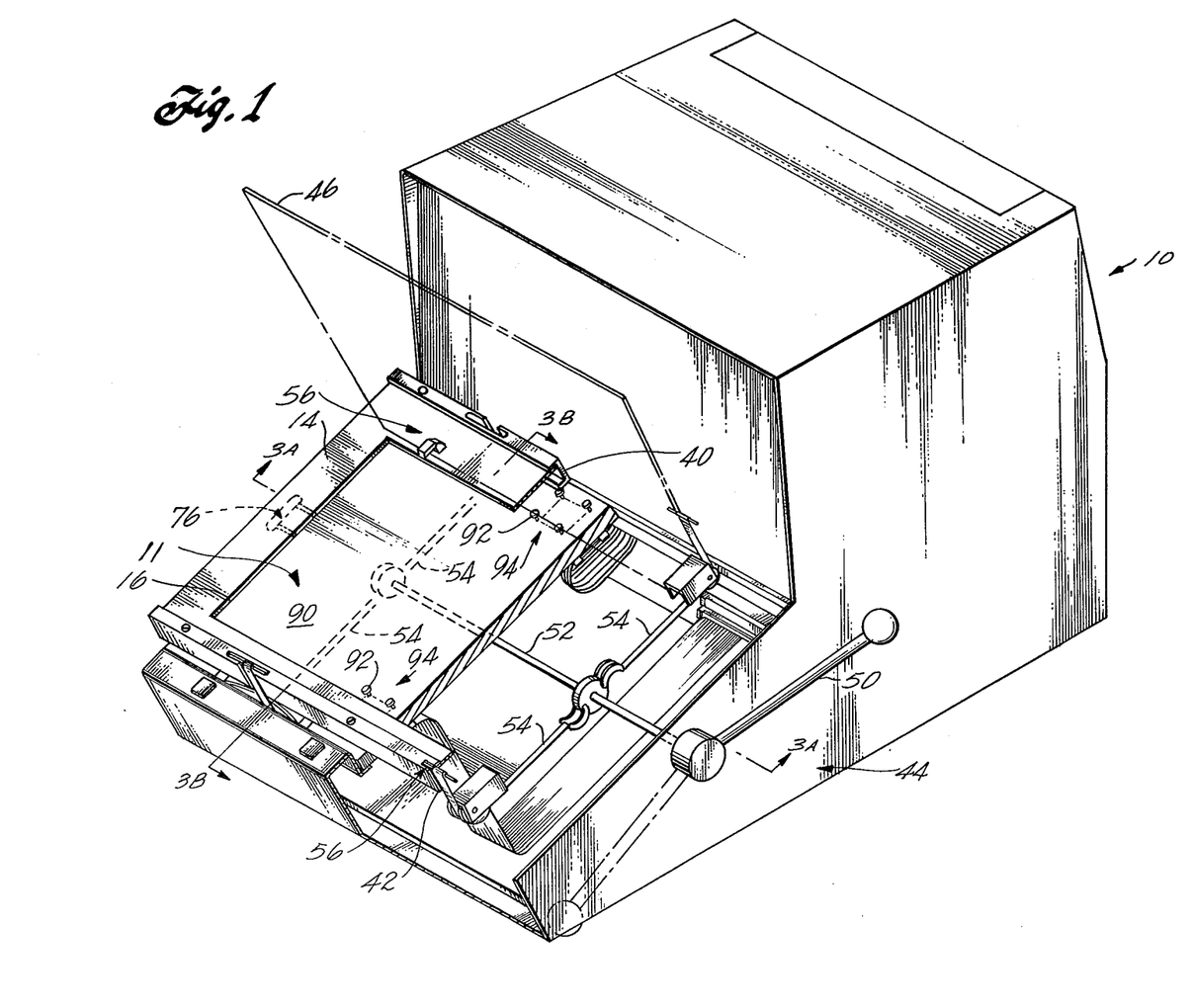
FIG. 1 is a pictorial and schematic drawing of a circuit board verifier for practicing the present invention. The access cover is shown in phantom line to reveal the parts which would otherwise be hidden by the access cover.
Figure 2:
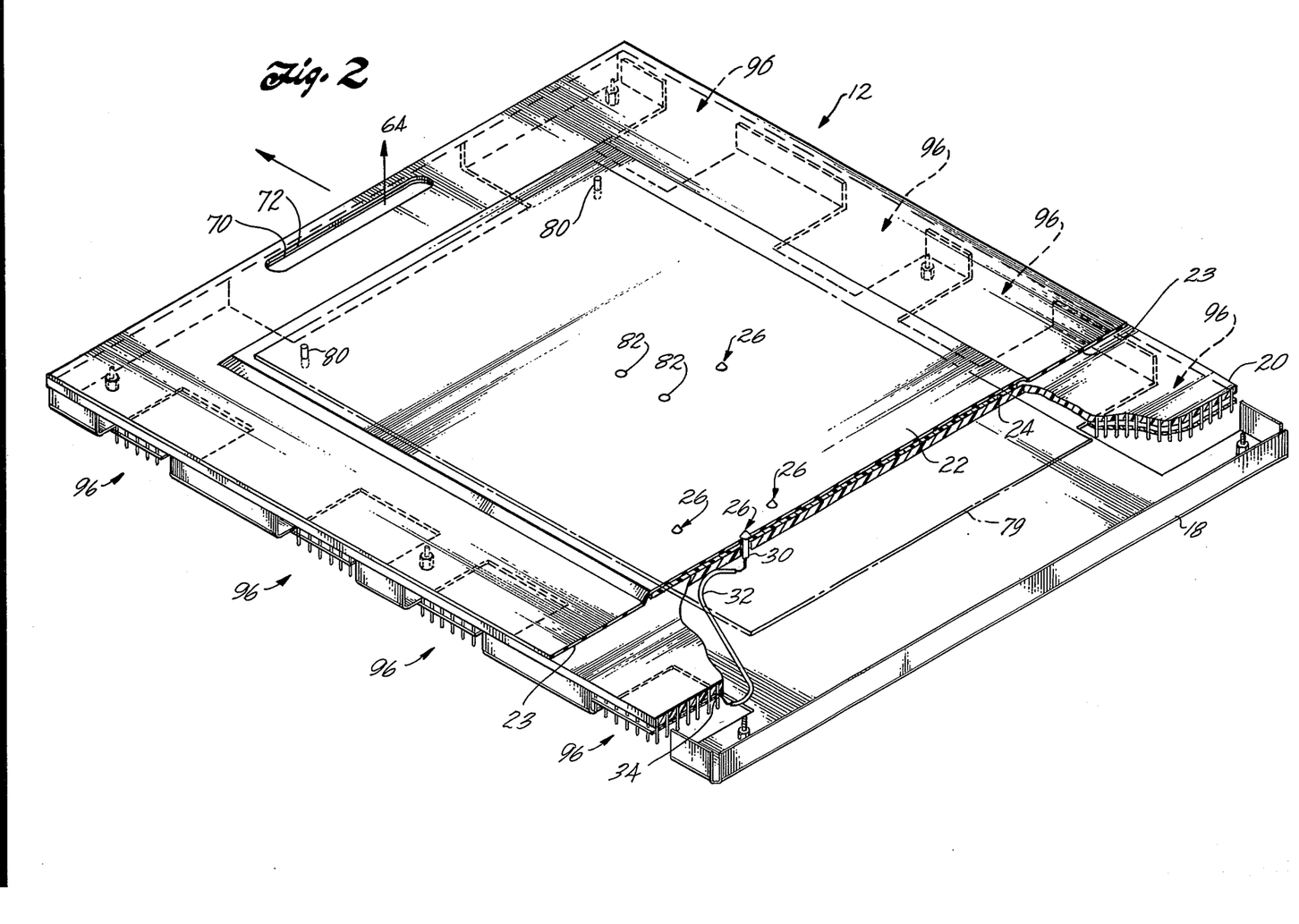
FIG. 2 is a diagrammatic view of an interchangeable test head for the circuit board verifier of FIG. 1, partly in cross-section.

A cavity 11 is provided for receiving the interchangeable test head 12 depicted in FIG. 2. The cavity 11 is surrounded by a rectangular frame 14 providing a rectangular opening 16. FIG. 1 shows the right hand portions of the frame 14 and an interface plate 90 broken away to reveal the underneath portions of the tester. The interchangeable test head 12 (FIG. 2) is inserted into the verifier from the right hand side depicted in FIG. 1.

Before considering the remainder of the portions of the verifier depicted in FIG. 1, consider the details of the interchangeable test head 12 of FIG. 2. The interchangeable test head 12 includes a rigid head plate 20 (FIG. 2) on which is mounted a cover 18. The head plate 20 is preferably made of a rigid insulating material such as phenolic, is rectangular and extends to the ends of the cover 18.

A diaphragm member 22, of a resilient material such as neoprene, is provided and, although the shape is not essential to the present invention, has a rectangular shape of substantially the same size as the head plate 20. A rectangular shaped backup plate 24 is affixed to the diaphragm 22. The backup plate 24 has a substantially planar surface adjacent the diaphragm. The backup plate 24 is preferably made of a semi-rigid insulating material and is preferably affixed over its entire surface by cement or other means to the adjacent surface of the diaphragm 22.

The diaphragm member 22 is affixed by cement or other means to the head plate 20 at 23, completely around the perimeter of the backup plate 24. The flexibility of the diaphragm around the perimeter of the backup plate allows the diaphragm and the backup plate to be forced away from the head plate 20 towards a test member responsive to the creation of vacuum in the chamber above the diaphragm. The flexibility and resiliency of the diaphragm around the perimeter of the backup plate draws the diaphragm and the backup plate away from the test member towards the head plate upon restoration of atmospheric pressure in the chamber.

Figure 3A:
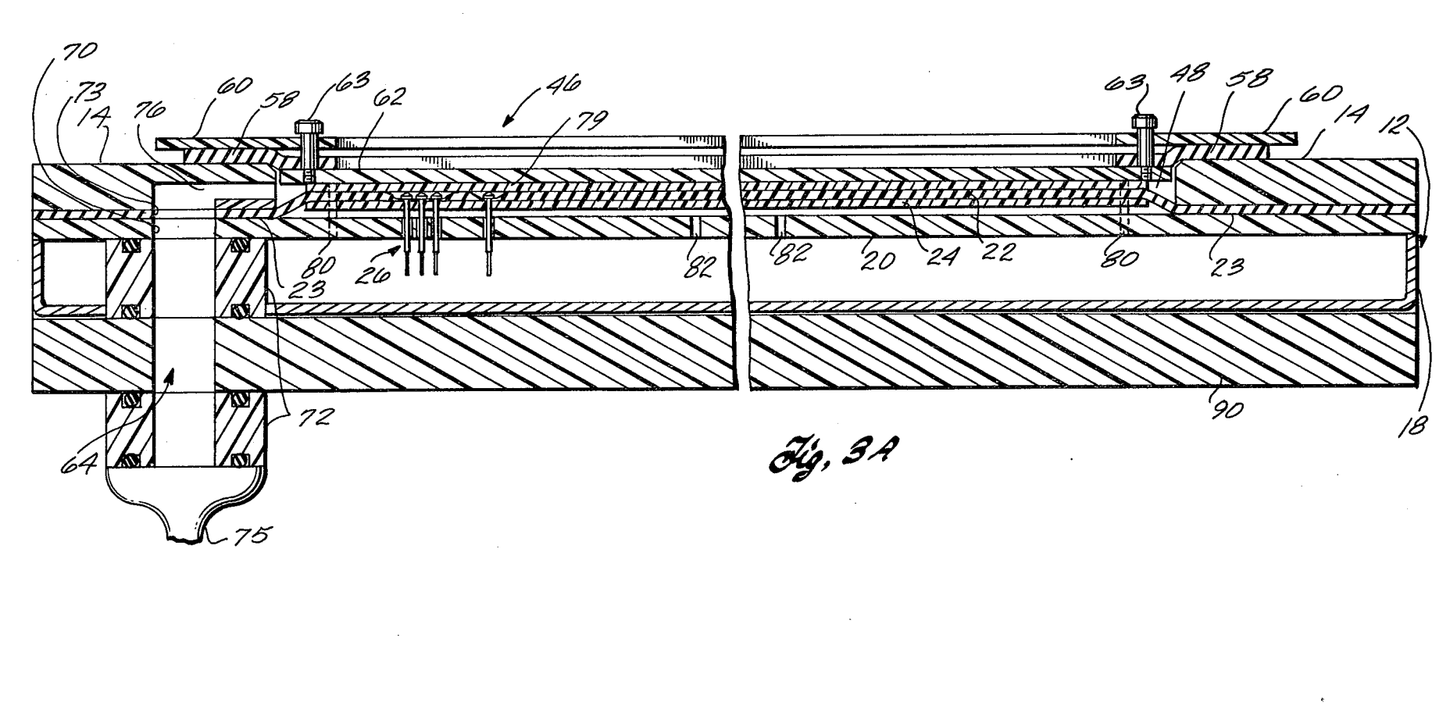
FIG. 3A is a section view taken along lines 3A—3A of FIG. 1, illustrating the circuit board verifier with the interchangeable test head in place, the access cover closed, and with the assembly in an actuated condition.
Figure 3B:
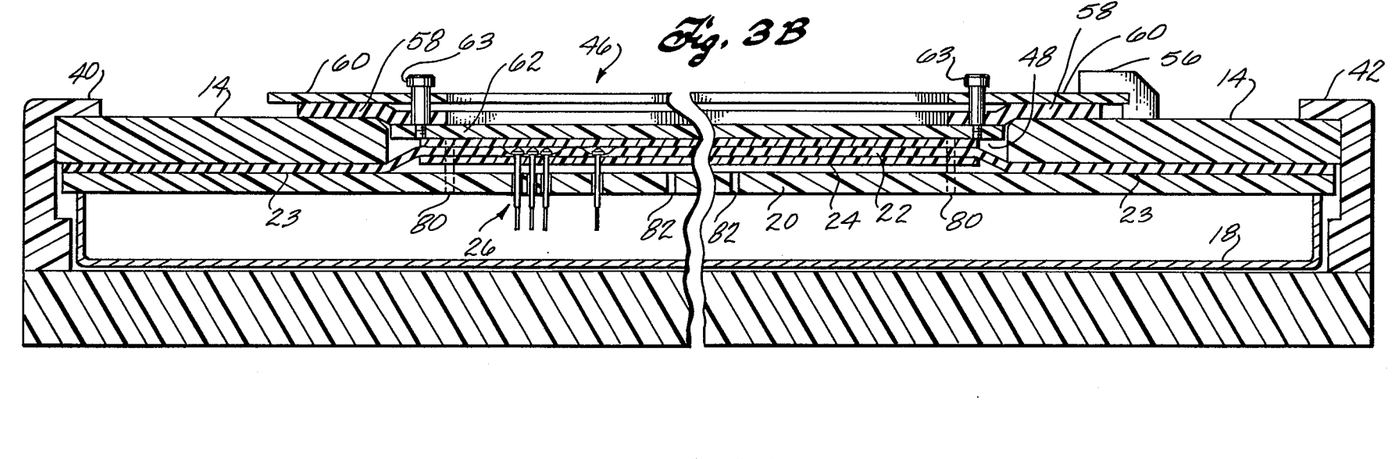
FIG. 3B is a section view taken along lines 3B—3B of FIG. 1 illustrating the circuit board verifier with the interchangeable test head in place, the access cover closed, and with the assembly in an actuated condition.
Figure 3C:
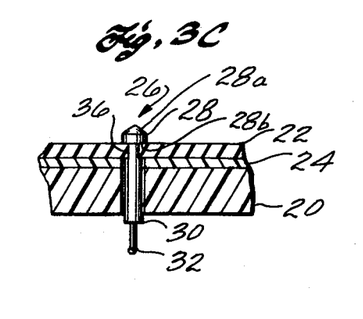
FIG. 3C is an enlarged section view of a portion of the diaphragm, the backup plate and the head plate and showing the mounting of a probe.

Significantly, an array of probes 26 are mounted on the diaphragm, as shown in more detail in FIG. 3C, so that they are carried with the movement of the diaphragm. Although other materials may be used, each probe 26 is formed of a conductive metal material, is preferably round in cross-section, and is elongated. Each probe has a probe head 28 having, oppositely facing, a contact side 28a and a bearing side 28b. A conductor extends from the bearing side 28b of the probe head 28 to an opposite end 30 which is affixed by way of soldering, crimping, wire wrapping, or other means well known in the art, to a wire 32 which in turn is connected to a corresponding interface pin 34 as depicted in FIG. 2. One interface pin 34 is provided for each of the probes 26 with a separate wire connection therebetween. The head plate and backup plate are non-conductive and have clearance holes through which the conductive probes 26 extend as depicted in FIG. 3C. Additionally, the clearance holes in the head plate serve as a guide for the probes.

Each of the probes has an annular recess 36 behind the head 28 into which the diaphragm 22 extends. The recess 36, along with the closely surrounding diaphragm 22, captures and holds the probe 26 in its axial position with the diaphragm in engagement with the bearing side 28b. With this arrangement the diaphragm carries each probe 26 as the backup plate and diaphragm move relative to the head plate 20.

Referring to FIGS. 1 and 3B, the test head cavity 11 in addition to the rectangular frame 14 has U-shaped test head guide rails 40 and 42 positioned on the upper and lower opposite sides of the rectangular frame member 14 as seen in FIG. 1. The interchangeable test head of FIG. 2 slides into the test head guide rails 40 and 42 from the right hand end as seen in FIG. 1. By way of example, the interchangeable test head is inserted in the direction of the arrow depicted in FIG. 2. When the interchangeable test head is fully positioned to the left in FIG. 1, a test head lockdown mechanism 44 is actuated, causing a seal between the diaphragm 22 and the underneath side of the rectangular frame member 14 and around the manifold opening 68, as depicted in the section view of FIG. 3A. As a result, when the access cover 46 (depicted by phantom line in FIG. 1 and shown in cross-section in FIGS. 3A and 3B) is closed, a sealed chamber 48 is formed between the access cover 46 and the interchangeable test head 12.

Although the details thereof are not essential to the present invention, the test head lockdown mechanism 44 includes a lever arm 50 connected to a rotatable shaft 52 which in turn is connected to pulldown straps 54. The pulldown straps 54 are hooked into the test head guide rails 40 and 42. As a result, rotation of the arm 50 counter-clockwise to the position depicted by phantom line in FIG. 1 causes the straps 54 to draw the test head guide rails 40 and 42 and hence the rectangular frame 14 downward until the lower surface of the rectangular frame 14 engages and seals against the upper surface of the neoprene diaphragm 22 and around the manifold opening 64.

Refer now to the construction of the access cover 46 as depicted in cross-section in FIGS. 3A and 3B. The access cover 46 is pivoted by means of two hinges 56 (only one being shown in FIGS. 1 and 2) to the frame 14. The hinges 56 are conventional hinges the details of which are not important to the present invention.

The access cover 46 includes a carrier frame 60. Although not essential to the present invention, the carrier frame 60 has an essentially rectangular picture-frame type construction. A neoprene gasket 58 is bonded to an access plate 62. The gasket 58 is generally of the same shape as the carrier frame 60. The access plate 62 has a substantially planar surface facing into the chamber 48 and has a rectangular outer perimeter which is slightly larger than the opening in the carrier frame 60 and the gasket 58. Stripper bolts 63 have one end connected into the access plate 62 and extend through clearance holes in the carrier frame 60 which guide the access plate 62 away from and towards the carrier frame 60 during actuation and deactuation. With this construction the access cover 46 may be rotated away from and into a closed position with respect to the chamber 48 and, when in a closed position, the gasket 58 forms an airtight seal with the rectangular frame 14 thereby completing the closed chamber 48.

A passage 64 extends into the chamber 48 and includes an opening through manifolds 72 attached to the interface plate 90, opening 70 in the head plate 20, opening 73 in the diaphragm 22 and an L-shaped passage portion 76 formed in the rectangular frame 14. A conduit 75 is connected to the passage 64 and vacuum applied in the conduit 75 is used to draw a vacuum through the passage 64 in the chamber 48 between the diaphragm 22 and the access cover 46, drawing the access plate 62 and the diaphragm 22 relatively closer together. It should be noted that assembly of FIGS. 3A and 3B are shown in the actuated condition wherein vacuum has been applied.

Consider briefly the operation of the circuit board verifier. Initially the interchangeable test head 12 is inserted into the circuit verifier between the test head guide rails 40 and 42, and the lever arm 50 of the test head lockdown mechanism 44 is actuated causing the diaphragm 22 to seal against the underside of the rectangular frame 14, thereby forming a lower wall of the chamber 48. With the access cover 46 open, a test member with planar test points such as a printed circuit board 79, is positioned with its locator holes over locator pins 80. In this manner the circuit board 79 is located at a precise location for test in proper orientation relative to the probe heads. Subsequently the access cover 46 is rotated to the closed position depicted in FIGS. 3A and 3B with the gasket 58 in engagement with the rectangular frame 14. In this manner the access cover 46 forms the upper wall of the closed chamber 48, with the rectangular frame member 14 forming side walls between the upper and lower walls. At this step in the operation the neoprene gasket 58 and the diaphragm 22, respectively, are drawing the access plate 62 and probes 26 away from the printed circuit board 79 as compared with the condition depicted in FIGS. 3A and 3B.

The chamber 48 and the passage 64 form a means for applying a force through the backup plate 24 and the resilient diaphragm 22 to the bearing sides of the probe heads, forcing the contact sides of the probe heads in the direction of the circuit board 79. Specifically, vacuum is applied through the conduit 75 and the passage 64 to the closed chamber 48, forming a pressure differential between the inside and outside of the chamber 48 and forcing the backup plate 24 and resilient diaphragm 22 to apply pressure to the bearing sides of the probe heads. As a result, the probe heads are forced tightly against the test points on the circuit board 79. The resilient diaphragm 22 deforms under the pressure exerted by the backup plate 24, ensuring that the contact surfaces of all of the probe heads tightly engage their respective test points on the printed circuit board 79 as depicted in FIGS. 3A and 3B.

A difference in pressure is also applied across the diaphragm formed by the gasket 58 and cover plate 62, drawing the same against the printed circuit board 79, applying a force to the printed circuit board 79 in opposition to the force of the probe heads as depicted in FIGS. 3A and 3B. Since the access plate 62 is substantially rigid and planar, it maintains the printed circuit board 79 in a substantially planar condition.

The relative hardness and flexibility of the diaphragm and backup plate is important and should be noted. The backup plate is harder than and substantially stiffer, or more rigid than the diaphragm but is sufficiently flexible so that as vacuum is applied, the pressure on the backup plate forces the backup plate to substantially conform to the surface contour of the printed circuit board in the pressurized condition. Any remaining irregularity between the surface contour of the backup plate and printed circuit board will be compensated for by resiliency of the diaphragm so that all probe heads will be in contact with the printed circuit board.

With such an arrangement the test member or printed circuit board can be rigid or flexible and in the latter case will conform to the planar surface of the access cover plate 62 under the pressurized condition.

In a preferred embodiment the backup plate 24 is 1/32 inch thick, the diaphragm 22 is 1/16 inch thick and the access plate 62 is ⅛ inch thick. The Shore hardness of the diaphragm is between 20 and 30 and that of the backup plate is Rockwell M100.

Preferably the access plate 62 is made from an insulating material such as polystyrene or phenolic so that a double sided printed circuit board can be tested without shorting the conductors adjacent the access plate.

The plate 20 is solid. Therefore, vent holes 82 are provided through the plate 20 to the backup plate 24 to allow atmospheric pressure to exist at the bottom side of the backup plate 24 and the diaphragm 22 so that as vacuum is applied in the chamber 48, the diaphragm and the backup plate are forced by atmospheric pressure towards the circuit board 79.

The interface plate 90 (FIG. 1) is located below the test head guide rails 40 and 42. Referring to FIG. 2, the interchangeable test head has eight groups 96 of wire wrap pins 34, each wire wrap pin 34 as discussed above being connected to one of the probes 26. Each of the pins 34 is connected to the rest of the electrical circuitry (not shown) in circuit board verifier 10 through a separate telescoping spring probe 92 (FIG. 1). Thus, for each of the wire wrap pins 34 there is a corresponding spring probe 92 on the interface plate 90 which makes electrical contact with the end of such wire wrap pin 34 when the assembly composed of the rectangular frame 14 and the test head guide rails 40 and 42 is drawn down by counter-clockwise movement of the handle 50.

Figure 4:
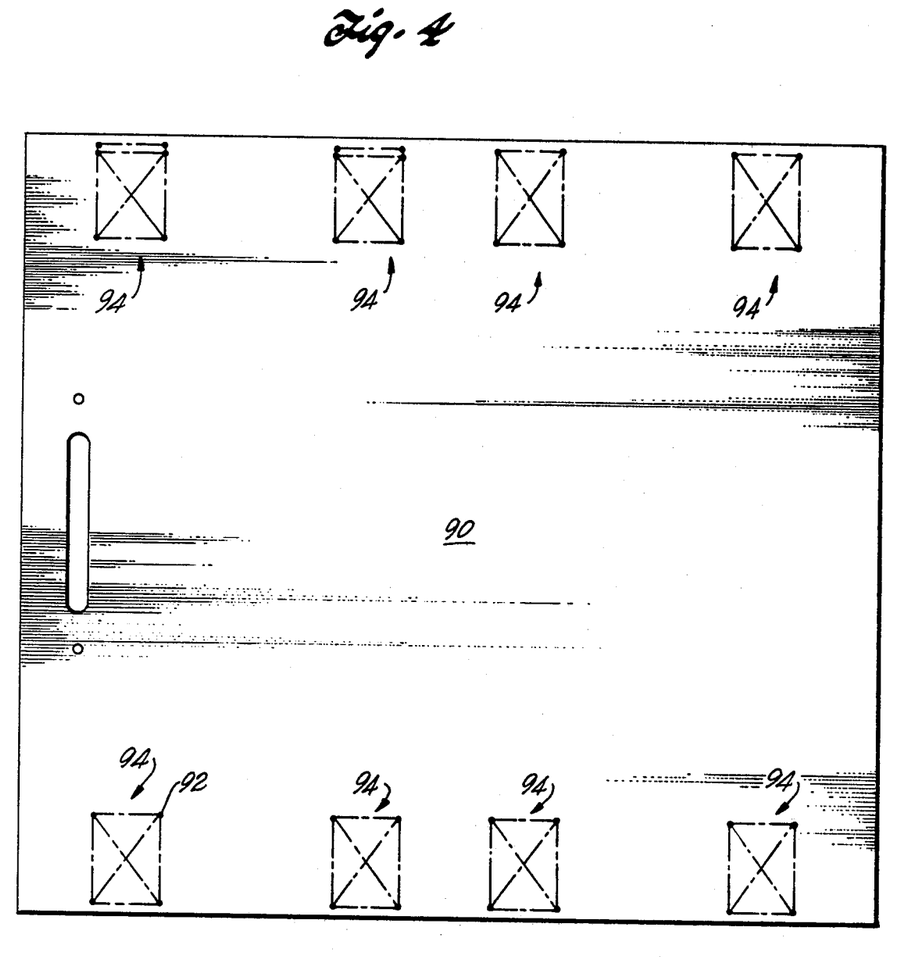
FIG. 4 is a sketch illustrating the layout of the contacts on the interface plate of FIG. 1.

Not all of the spring probes 92 can be seen in FIG. 1. However, FIG. 4 schematically illustrates that the telescoping spring probes 92 are arranged in eight groups 94 at positions which are mirror image to the corresponding groups 96 of pins 34.

Figure 5:
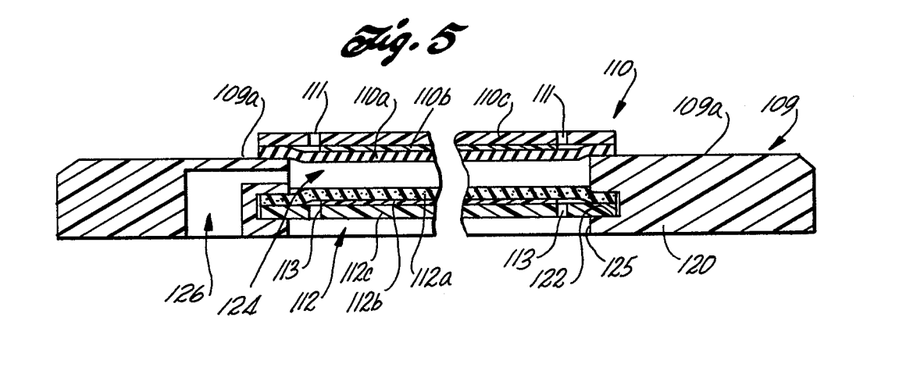
FIG. 5 is a sectional view of an alternate embodiment of the present invention.

FIG. 5 shows a section view of an alternate embodiment of the present invention employing a frame 109 in the form of a rectangular picture frame. An access cover 110 is pivotally mounted by hinges or other means well known in the art (not shown) to the upper surface 109a of the rectangular frame 109. The construction of the access cover 110 includes a rectangular shaped resilient diaphragm 110a and a rigid rectangular shaped backup plate 110b with one side affixed to the diaphragm. The diaphragm 110a is affixed to a rectangular shaped and rigid mounting plate 110c. Vent holes 111 allow atmospheric pressure to reach the side of the diaphragm 110a which is opposite from the chamber 124.

The rectangular frame member 109 has a rectangular shaped groove 122 extending around its rectangular shaped inner opening 125. A lower plate assembly 112 forming a wall includes a rectangular shaped diaphragm member 112a, a rectangular shaped backup plate 112b affixed to the diaphragm member 112a, and a support plate 112c. The lower plate assembly 112 is affixed within the groove 122 in such a manner that an air-tight seal is formed, leaving the air-tight chamber 124 between the access cover 110 and the lower diaphragm 112a. Vent holes 113 extend through the support plate 112c.

An L-shaped fluid passage 126 extends through the rectangular frame 109 into the chamber 124 allowing vacuum to be applied into the chamber 124 for the purposes described with reference to FIG. 1. Probes (not shown) are affixed to the diaphragm and a product such as a printed circuit board (not shown) is positioned between the diaphragm for contact with the probes as described above.

Figure 6:
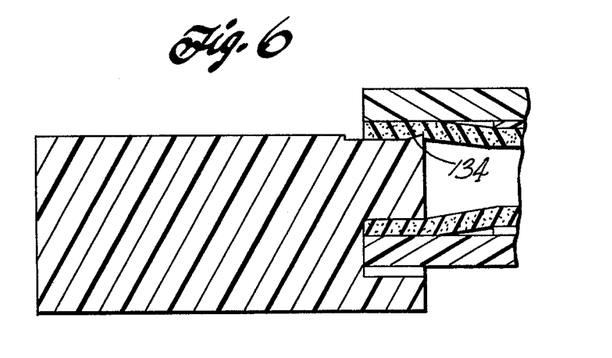
FIG. 6 is a sectional view of a portion of still another alternate embodiment of the present invention.

FIG. 6 depicts still another alternate embodiment of the invention similar to that depicted in FIG. 5 in which a sharp shoulder 134 engages the diaphragm member on the access cover, thereby improving the seal therebetween.

Although an exemplary embodiment of the invention has been disclosed for purposes of illustration, it will be understood that various changes, modifications and substitutions may be incorporated into such embodiment without departing from the spirit of the invention as defined by the claims appearing hereinafter.

What is claimed is:

1. Apparatus for making electrical contact with test points on a test member, comprising:
   means for mounting such a test member at a location for test;
   a plurality of conductive probe heads each having, oppositely facing, a contact side and a bearing side, the contact sides of said probe heads being positioned adjacent said test member location;
   backup means having a bearing side;
   at least one resilient member having one side adjacent the bearing sides of said probe heads and an opposite side adjacent the bearing side of said backup means; and
   means for applying pressure through said backup means and said at least one resilient member to the bearing sides of said probe heads forcing the contact sides thereof in the direction of said test member location, said backup means being harder than and substantially more rigid than said resilient member but sufficiently flexible so that with the probe heads in engagement with such test member in said location therefor the backup means conforms to the shape of the facing surface of such test member and said resilient member deforms so that all of said probe heads are forced into engagement with such test points.

2. Apparatus according to claim 1 wherein said backup means and said at least one resilient means are bonded together.

3. Apparatus according to claim 1 comprising resilient means for supporting said backup means.

4. Apparatus according to claim 3 comprising resilient diaphragm means for supporting said backup means and wherein said means for applying a force comprises means for creating a pressure differential across said resilient diaphragm means and said backup means.

5. Apparatus according to claim 1 comprising a conductor extending from each of said probe heads for making an electrical connection therewith.

6. Apparatus according to claim 5 wherein each of said conductors extends from the bearing side of the corresponding probe head through said at least one resilient member and said backup means.

7. Apparatus according to claim 6 wherein each said probe head and the corresponding conductor comprises a probe having an annular recess around said conductor into which said at least one resilient member extends.

8. Apparatus for making electrical contacts with test points on a test member comprising:
   means for mounting such a test member at a location for test;
   a resilient diaphragm member;
   backup means having a bearing side adjacent a portion of said resilient diaphragm member;
   a plurality of spaced conductive probe heads, each having oppositely facing, a contact side which is adjacent to said test member location and a bearing side which is adjacent to the opposite side of said diaphragm member from the bearing side of said backup means; and
   means for applying a pressure differential across said diaphragm member and backup means causing pressure through said backup means and said diaphragm member to the bearing sides of said probe heads forcing the contact sides thereof in the direction of said test member location, said backup means being harder than and substantially more rigid than said diaphragm member but sufficiently flexible so that with the probe heads in engagement with such test member in said location therefor the backup means conforms to the shape of the facing surface of such test member and said diaphragm member deforms so that all of said probe heads are forced into engagement with such test points.

9. Apparatus according to claim 8 comprising means for rigidly mounting said diaphragm member around the outer perimeter of said backup means causing same to retract after such pressure differential has been removed.

10. Apparatus according to claim 8 wherein said means for applying a pressure differential comprises a substantially closed passage and an opening through which said pressure differential is formed.

11. Apparatus according to claim 8 comprising means for exerting a force on such test member in said test member location which is in opposition to the force created on such test member by said probe heads.

12. Apparatus according to claim 11 wherein said means for exerting a force comprises a substantially rigid member having a substantially planar side facing said test member location.

13. Apparatus for making electrical contact with test points on a test member, comprising:
   a substantially closed chamber for receipt of a test member at a test member location;
   a plurality of conductive probe heads each having, oppositely facing, a contact side and a bearing side, the contact sides thereof being positioned adjacent said test member location;
   backup means comprising a bearing side;
   at least one resilient diaphragm member forming a wall of said chamber and having one side adjacent the bearing sides of said probe heads and an opposite side adjacent the bearing side of said backup means; and
   means for creating a pressure differential between the inside and outside of said chamber thereby creating pressure through said backup means and said at least one resilient diaphragm member to the bearing sides of said probe heads forcing the contact sides thereof in the direction of said test member location, said backup means being harder than and substantially more rigid than said resilient diaphragm member but sufficiently flexible so that with the probe heads in engagement with such test member in said location therefor the backup means conforms to the shape of the facing surface of such test member and said resilient diaphragm member deforms so that all of said probe heads are forced into engagement with such test points.

14. Apparatus according to claim 13 comprising means for mounting such test member in the location therefor in a fixed orientation relative to said probe heads.

15. Apparatus according to claim 13 comprising means positioned on the opposite side of said test member position from said probe heads for exerting a force on such test member in opposition to forces applied thereto by said probe heads.

16. Apparatus according to claim 13 wherein said chamber comprises an additional wall positioned on the opposite side of said test member location from said diaphragm, said wall comprising means responsive to a difference in pressure thereacross for movement towards a test member in said test member location to thereby exert a force on such test member in opposition to the force thereon by said probe heads.

17. Apparatus according to claim 16 having an access cover which comprises said additional wall.

18. Apparatus according to claim 17 wherein said chamber comprises at least one further wall extending between said wall and said additional wall;
   said additional wall comprising carrier means;
   means for mounting said carrier means for movement of said additional wall into and away from a closed position with respect to said further wall;
   resilient means mounted on said carrier means;
   a substantially rigid means mounted on said resilient means and having a substantially planar side adjacent said test member location;
   said means for forming a pressure differential comprising means for forming a pressure differential across said resilient means and said substantially rigid means, said resilient means permitting said substantially rigid means to move in the direction of said test member location in response to such pressure differential and for drawing said substantially rigid means in a direction away from said test member location when such pressure differential is withdrawn.

* * * * *